United States Patent
Colvin et al.

[11] Patent Number: 6,165,648
[45] Date of Patent: Dec. 26, 2000

[54] HOLOGRAPHIC RECORDING

[75] Inventors: Vicki L. Colvin, Springfield; Alexander Lowe Harris, Maplewood; Howard Edan Katz, Summit; Marcia Lea Schilling, Basking Ridge, all of N.J.

[73] Assignee: Lucent Technologies Inc., Murray Hill, N.J.

[21] Appl. No.: 09/156,713

[22] Filed: Sep. 18, 1998

Related U.S. Application Data

[62] Division of application No. 08/698,143, Aug. 15, 1996, Pat. No. 5,874,187.

[51] Int. Cl.[7] .................................................. G03H 1/04
[52] U.S. Cl. .................... 430/1; 430/2; 430/394; 359/3
[58] Field of Search .................................. 430/1, 2, 394; 359/3

[56] References Cited

U.S. PATENT DOCUMENTS

| | | | |
|---|---|---|---|
| 3,667,946 | 6/1972 | Sturdevant | 430/1 |
| 4,983,003 | 1/1991 | Wreede et al. | 359/3 |
| 5,477,347 | 12/1995 | Redfield et al. | 359/3 |
| 5,874,187 | 2/1999 | Colvin et al. | 430/2 |

*Primary Examiner*—Martin Angebranndt
*Attorney, Agent, or Firm*—George S. Indig

[57] ABSTRACT

A thick holographic recording medium suitable for use in multiplex holography is prepared from a solution of a bi-functional oligomer and a mono-functional monomer. Precuring, possibly at the same radiation wavelength used for recording, cross-links the oligomer, thereby creating a host for the recording monomer.

7 Claims, 1 Drawing Sheet

HOLOGRAPHIC RECORDING

This is a division of application Ser. No. 08/698,143, filed Aug. 15, 1996, now U.S. Pat. No. 5,874,187, issued Feb. 23, 1999.

TECHNICAL FIELD

Photopolymeric information storage.

DESCRIPTION OF RELATED ART

There has been a growing interest in the use of multiplex holography for information storage. Used for storage of digital information, holography is now regarded as a realistic contender for functions now served by CD-ROM. "Shift Holography" is a volume holographic method which depends on partially overlapping holograms, recorded page-by-page on each new position of a shifting medium, with differentiation based on Bragg selectivity. See, A. Pu, et al., 1995 *OSA Conference on Optical Computing, OSA Technical Digest Series*, vol. 10, pp. 219–221. A similar method, but permitting use of a thin recording medium, is described and claimed in U.S. patent application Ser. No. 08/435,705, May 5, 1995. In that process, "Phase Correlation Multiplex Holography" (PCMH), differentiation of holographic pages during recording and reconstruction depends on page-specific phase information imparted by a phase mask.

It is generally accepted that a suitable recording medium is not yet commercially available. Iron-doped lithium niobate has served for laboratory use for many years, and was used in reported work on shift holography. Disadvantages include: costliness; poor sensitivity; danger of noise due to damage inflicted during read-out.

Photopolymeric recording is promising. Hoped-for materials, dependent on refractive index change resulting from polymerization in lighted areas, would be deposited as layered material of requisite perfection and uniformity. A photopolymer film offered by duPont is based on light-induced free-radical polymerization of acrylate monomers. See, W. K. Smothers, et al., "Photopolymers for holography", *SPIE OE/Lase Conf. Proc.*, 1212–03, Los Angeles, Calif. (1990). The duPont material is believed to be the sole commercial offering and has served as a model for subsequent work. It consists of liquid monomeric material and photoinitiator in an inert host polymer. During writing, monomer diffuses from dark to lighted regions responsive to polymerization-induced depletion. Index change is due to the resulting composition gradient created as unreacted monomer migrates to lighted regions from unlighted regions and/or to index change due to polymerization itself. Certainly promising, limited thickness of ~150 $\mu$m, high scattering and high polymerization-induced shrinkage of ~4–10%, severely limit use.

Efforts made to substitute an in-situ polymerized matrix for the duPont matrix polymer are thought to be due to a perceived difficulty—solvent used to reduce viscosity of the polymer for application to the substrate must be completely removed after coating, imposing thickness limitation on the film. D. -J. Lougnot in "Photopolymer Recording Materials for Holography—Some recent developments", *SPIE*, pp. 10–22 (1993) uses a mixture of monomers—one of which is pentafunctional and highly reactive which polymerizes and forms a matrix in a precuring step. Experiencing difficulty due to depletion of photoinitiator needed for recording, the author resorts to precuring by direct photoabsorption using deep-UV radiation. The resulting medium resembles the duPont film, consisting of a matrix host for the actinic monomer and photoinitiator. Reported maximum film thickness is 100 $\mu$m.

SUMMARY OF THE INVENTION

A new, high-quality, low-scatter photopolymer recording medium has been used satisfactorily in phase correlation multiplex holography. Diffraction efficiencies of up to 100% in 170 $\mu$m thick layers have been achieved. Film thicknesses of a few mm have been realized without sacrifice in quality.

As in earlier materials, the photopolymer consists of a polymer matrix, with actinic properties contributed by diffusing monomeric species in the presence of photoinitiator. The matrix is polymerized in-situ, but differs from earlier efforts in being formed by crosslinking a multi-functional oligomer, with precuring conditions designed to leave a fraction of mono-functional actinic monomer unreacted. A preferred embodiment uses a three-layer structure with the active recording medium sandwiched between glass plates.

Terminology

Figure 1:
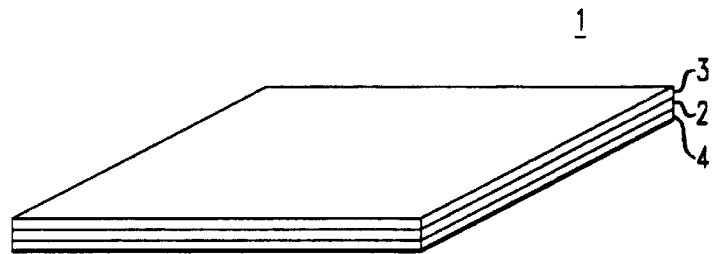
FIG. 1 is a perspective view of a recording medium in accordance with the invention.

Oligomer—Molecule of 1000–5000 mol.wt. with at least two spaced functional groupings. Often constituted of repeating monomeric units, functional characteristics do not depend on the remainder of the molecule.

Monomer—Of $\leq$500 mol.wt.—where used without a modifier, the term refers to a monofunctional molecule which, upon polymerizing, is primarily responsible for recording. While used in the singular, multiple monomers are contemplated. Elsewhere the term is generic to materials which react responsive to radiation—so that, e.g., "additional monomer" is used in the description of added material reacting preferentially during matrix formation for the purpose of enhancing contrast.

Actinic Monomer—Photopolymerizing monomer primarily responsible for recording. This terminology is used for describing "monomer" in compositions containing additional monomeric material which may make little contribution to the recording function.

Molecule—Also of $\leq$500 mol.wt., the term is generic to "monomer" but includes any additional material which, while not photoreacting, upon migrating responsive to photopolymerization, may contribute to recording.

DETAILED DESCRIPTION

General—The advance depends critically on the nature of the starting materials from which the recording medium is fabricated. The Examples are based on familiar photopolymer chemistry, here used in photopolymerization of oligomer and monomer, and discussion is largely in these terms. In a preferred embodiment, both polymerization reactions are initiated by light in the visible spectrum under the influence of a single photoinitiator. This is advantageous in reducing scatter—an effect thought to be due to incorporation of a portion of the monomer in the matrix but consumes monomer during precuring. Preservation of the needed fraction of unreacted monomer following precuring, is readily achievable even with oligomer and monomer of similar reactivity. (In an example, using acrylate chemistry for both matrix and recording, retention of unreacted monomer is a consequence of the statistically-favored likelihood of at least partial curing of the polyfunctional oligomer—reaction of a single functional group in each oligomer molecule is sufficient to immobilize the matrix.) Satisfactory results for this preferred embodiment are attributed to the specified oligomer-monomer composition and claims are of this scope.

The oligomer-monomer composition provides for lessened exposure induced shrinkage. Composition may be selected for yielding viscosities convenient for application. As one consequence, film thicknesses of millimeters and greater are permitted. Dimensional control, particularly of millimeter and greater thicknesses, is expedited by use of a sandwich structure, with carefully-prescribed spacing between glass plates. Spacers were used in earlier experimental work and may be satisfactory. However, their use has been found to result in non-uniform or otherwise distorted active layers under some conditions. The effect has been avoided in later work by a procedure that does not use spacers, but instead maintains embracing glass plates parallel by optical interferometry. Plates of 1 mm thickness, are found satisfactory for actinic layer thicknesses of up to 400 $\mu$m. Thicker plates may be needed to minimize bowing in thicker samples.

A stratified structure made up of stacked alternating layers of glass and actinic material, has been found to yield excellent results while lessening distortion (relative to a single-sandwich structure of the same total photopolymer thickness). It is particularly useful for phase correlation multiplex holography in which selection need not depend on Bragg angle. (For Bragg-angle selection, alternating inactive support plates introduce unwanted modulation which complicates reconstruction.) Interferometry has been used here as well for assuring parallelicity in stratified media.

In the main, aside from combination of oligomer and monomer and precuring-writing conditions for best using the combination, the teaching depends on known considerations. Discussion is largely in state-of-the-art terms—e.g., assuming recording by use of a frequency-doubled Nd:YAG laser writing at 532 nm. A commercial single-component visible photoinitiator was found satisfactory. Little discussion is directed to alternatives—e.g. in the instance of the photoinitiator, single component materials operating at shorter wavelengths are readily available. Multi-component materials have been used, but spatially separated incidents required for initiating reaction with a single molecule reduce efficiency—are wasteful of initiator, and extend response time.

It has been convenient to form the cross-linked matrix, and to write with dependence on a single photoinitiator. A real-time monitoring procedure assures both effective cross-linking and sufficient retention of photoinitiator and monomer. Alternatives include thermal curing and use of light of wavelength other than used in recording. Such an alternative approach may permit more efficient use of monomer may altogether avoid consumption of monomer during matrix formation—and thereby increase contrast/sensitivity—it may, however, reduce compatibility between monomer and oligomer and so result in increased scatter.

A post-curing technique may be used to prevent further reaction. The precaution is commonly practiced. In an Example, post-curing takes the form of flood curing with a xenon lamp.

Composition

The Recording Medium—Relative amounts of the primary constituents may vary widely. Examples were conducted with cross-linking and writing conducted under the influence of the single photoinitiator in the same region of the visible spectrum. Under these conditions, a 60 wt. % oligomer—40 wt. % monomer, nominal ratio permitted convenient application, allowed adequate mobility of unreacted monomer, and left ~20% residual monomer (approximately corresponding with reaction of 80% of total polymerizable groups "80% cure") following precuring. Compositions with as little as 10% residual monomer were found adequate for needed sensitivity and contrast.

Composition of the recording medium is discussed in terms of a nominal composition consisting of:
  Oligomer—40–90 wt. %
  (Actinic) monomer—5–60 wt. %
  Photoinitiator—0.1–5 wt. %
  Other—$\leq$5 wt. %

The primary requirement is oligomer-monomer ratio is for assuring requisite matrix properties while retaining sufficient monomer for writing. Compositions may depart from nominal where reactive groupings on the oligomer and monomer differ, or where mechanisms of precuring and writing differ. While such variations may permit initial monomer content of as little as 1 wt. % (equal to the fraction of residual monomer in a preferred embodiment), an oligomer content of at least 40 wt. % is desired to assure the mechanical properties required of the matrix.

The Oligomer—The aliphatic oligomer used in the Examples, was a commercially-available material sold, e.g., as part of a UV-curable coating material for optical fiber. In other experiments, aromatic oligomers were used. The cross-linked aliphatic material characteristically has a low index of refraction relative to that of the polymerized monomer, so that, in general, increasing index contributed by the polymerization-induced monomer concentration gradient may be supplemented by increase in index produced by polymerization itself. In some work, the $\Delta$n is reversed in direction, either by use of a relatively high-index aromatic oligomer or by inclusion of a high-index monomer (in addition to the actinic monomer) of reactivity to preferentially react with the oligomer during precuring. An oligomer molecular weight range of 1000–5000, or preferably 1000–3000, is chosen for ease of fabrication (while dispensing with need for solvent), and has sufficient mechanical integrity, lessening shrinkage and permitting fabrication of thick layers.

Facility for preparation of layers $\geq$200 $\mu$m or even "thick" layers—layers $\geq$1 mm—shows a further advantage (in addition to facilitating Bragg angle selection in accordance with A. Pu, et al., cited above). It has been noted that, under usual circumstances, compositional gradient is the major contributor to dynamic range. This contribution scales with sample thickness—so that thicker layers increase diffraction efficiency. A similar advantage is offered by stratified structures, with equivalent total actinic layer thicknesses (although, as also noted, stratified structures are unsuited for Bragg angle selection).

In addition to ease of fabrication, available oligomers offer a wide array of properties, e.g., in refractive index, to facilitate design. Lowered scatter is attributed to compatibility between the oligomer and monomer. Use of the same reactive groupings—or of other groupings of similar reactivity—resulting in some monomer reaction during precuring—contributes. Increased oligomers molecular weight $\geq$5000 may retain compatibility advantage and may be useful where fabrication permits. (Studies underway, however, deliberately avoid monomer-oligomer reaction so that interfacial scatter effectively improves contrast in the recorded image.) Oligomeric material used has been bifunctional. Tri-functional molecules, at least for the higher molecular weight values (permitting greater separation of functional groupings), may be suitable. Still higher functionality with resulting increasing cross-linking is likely to impair monomer diffusivity sufficiently to affect performance. Under test conditions, for grating spacings of 800 nm, diffusion time (exposure time) of 100 seconds requires monomer diffusion constants on the order of $10^{-9}$ cm$^2$ sec$^{-1}$.

Commercially-available oligomers are constituted of a polymer backbone of repeating monomer units with well-separated reactive groupings ordinarily at either end of the chain. Choice of reactive groupings is important. Acrylates of the Examples may be replaced by other moieties of suitable reactivity. Epoxy compounds are examples of suitable oligomers which are readily available. The molecule backbone plays little function during recording and need only be chemically and physically compatible.

Monomer—Experiments with bifunctional monomer firmly establish a preference for monofunctionality. Two effects were noted in these experiments: 1) increased monomer-oligomer reaction during precuring reduced diffusivity sufficiently to prevent complete curing, and 2) precuring resulted in highly cross-linked matrix which lowered monomer diffusivity and reduced sensitivity. The effects are sufficiently avoided by provision that at least 70 wt. % of total actinic monomer is monofunctional.

A molecular weight $\leq 500$ for actinic monomer, assures adequate mobility for exposure-provoked diffusion for expected exposure-times. Provision for lower molecular weight $\leftarrow 250$ assures increased sensitivity (where needed contrast depends on concentration gradient). As in prior work, acrylate reactive groupings performed well. Examples include isobornyl acrylate, phenoxyethyl acrylate, diethylene glycol monoethyl ether acrylate and ethyl acrylate. Other monofunctional monomers are suitable, providing other conditions are satisfied e.g., re: oligomer reactivity. Suitable materials include the vinyl benzoate of Example 3, chlorinated analogs such as vinyl 3,5-dichlorobenzoate, and analogs with other cyclic conjugated moieties such as vinyl 1-naphthoate.

Modified monomer systems may be designed to enhance contrast. Where index is increased in lighted regions, high index acrylates such as 2-naphth-1-oxyethyl acrylate and 2-carbazol-9-ylethyl acrylate may be used. Suitable low index acrylates used where $\Delta n$ is of opposite sign, include (trimethylsilyloxy)dimethylsilylpropyl acrylate and (perfluorocyclohexyl)methyl acrylate. Any of these materials may serve as primary or sole actinic monomer, or maybe admixed with other monomer.

Additional monomer has been used to improve contrast. Maintaining total monomer inclusion at the nominal 40 wt. % level, inclusion of 10 wt. % of N-vinylcarbazole, largely reacted during precuring, increased index of the matrix (and increased $\Delta n$ in a system in which exposure-induced concentration gradient had the effect of reducing index in exposed regions). Other actinic monomers have been used to supplement the first actinic monomer and to increase the $\Delta n$.

Photoinitiator ("PI")—Except for the observation that single component photoinitiators are more effective, there are no unobvious requirements. Photoinitiators are commercially available for use over the entire visible spectrum and into the IR and UV spectra. One commercial product—bis(2,6-difluoro-3-pyrrolylphenyl) titanocene—was used in the reported Examples. In general, direct polymerization of monomer (without photoinitiator) is not contemplated particularly for thick layers, the required absorption for the actinic radiation becomes limiting. Photoinitiator inclusion of 0.1–5 wt. % provides a useful balance between absorption and rate of monomer polymerization.

As elsewhere, description is in terms of the embodiment of likely initial commercial interest. There are instances where other materials within the broad category of "catalyst" may serve to initiate polymerization under the influence of energy outside the visible spectrum. There are instances, too, in which UV, thermal energy, or other energy may directly initiate reaction without need for a catalyst.

Other—There may be a significant inclusion of another $\leq 500$ mol.wt. material in addition to active monomer which does not, itself, photopolymerize. It has been found that inclusion of a compatible material, e.g., bromobenezene, aids contrast. In one composition design, this non-monomer molecule flows counter to the direction of exposure-induced migration of monomer so as to enable a steep concentration gradient of monomer. This molecule is desirably of refractive index to further improve $\Delta n$—in systems in which index is increased in lighted regions, the added molecule is of smaller index. In another approach, the oligomer is chosen for yielding a matrix polymer which can "swell" in lighted regions to accommodate influx of monomer.

Inhibitor is ordinarily included in commercial oligomer and monomer materials. Generally of the phenolic category, it assures shelf-life of the unexposed medium.

Still other inclusions may be dictated. For example, one particular photoinitiator was found to result in a purple-colored residue which could be bleached by oxidation. Inclusion of <1 wt. % of t-butyl hydroperoxide avoided discoloration.

Structure

While, in broad terms, the invention is based on composition, and is independent of structure, thicker layers, in particular, benefit by the sandwich structure shown in FIG. 1. Recording medium 1 shown consists of actinic (oligomer-monomer derived) layer 2 between transparent plates 3 and 4. Actinic layer thicknesses of from a few $\mu$m to 3 mm have been made. Experimental films were supported between 1 mm-thick microscope slides. Thinner supports may be used for small area films. Thicker and larger-area films, may benefit by supporting plates more than 1 mm in thickness to minimize distortion.

Annular plastic spacers of from 0.015 to 0.5 mm have been used to fix the spacing between the glass plates, and thereby the polymer layer thickness. However, shrinkage of the photopolymer during cure causes stress around the spacers, with resulting reduction in optical quality. Since storage and readout of digital data pages by holography demands very high optical quality, an alternative method, which takes advantage of the in-situ precure step, is also used. In this method, the glass plates are held by adjustable mounts which can adjust both the spacing and tilt of the plates. The liquid photopolymer composition is placed between the plates to fill the gap, and the spacing and tilt are adjusted to give an optically flat sandwich with the proper photopolymer thickness. The spacing can be adjusted by initially placing the two glass plates in contact, which determines a reference zero thickness and then spacing, or by using absorption spectroscopy on the photopolymer material to determine thickness in-situ. Near-infrared absorption from polymer vibrational overtones, or visible absorption by the photoinitiator can be used for this purpose. The tilt is very precisely adjusted to eliminate optical wedging, using an optical interferometer, typically based on light at the helium-neon laser wavelength of ~632 nm which does not cause curing of the photopolymer mixture. Once the tilt and spacing are adjusted, the sample is precured while being held. The photopolymer shrinkage which occurs during precure is uniform across the sample, resulting in a uniform reduction in sample thickness with minimal distortion. Precured samples assembled by this method have had less than half of an optical fringe per cm of wedge or lensing in a transmission interferometer test. Samples prepared by in-situ optical interferometry have successfully been used in writing and reading digital page-oriented holographic data with acceptable bit error rates. Use of absorption spectroscopy of visible and ultraviolet peaks had resulted in accuracy of ±5% in the spacing range of 50–1000 $\mu$m.

Fabrication

A typical schedule is outlined:

The mixed composition was prepared in a foil-wrapped brown bottle to avoid exposure to light. After mixing monomer and other low molecular weight molecules, photoinitiator powder was added, and the mixture was stirred to completely dissolve the powder. (Viscous) oligomer was added to the solution and the resulting mixture was stirred overnight on a jar mill to dissolve the oligomer. Peroxide stabilizer for bleaching photoinitiator residue was added just before use. Final compositions were filtered through 20 $\mu$m, 10 $\mu$m (nylon) and 3 $\mu$m (silver membrane) filters, in succession in a nitrogen-pressurized stainless steel filter.

A sample of the oligomer-monomer composition was sandwiched between glass plates.

Precuring was by flood irradiation at the $\lambda$=546 nm mercury-emission line. Precuring time was determined by monitoring in the near IR spectrum to follow diminishing peak heights due to polymerization of acrylate groups. The amount of unreacted monomer was measured to an accuracy of ±2%. The quantity of retained monomer was varied for comparison purposes 20% was found to be a useful compromise between wanted matrix and exposure characteristics. (It is expected that batch-to-batch measurement will not be required in regular commercial production.) After precuring, samples are wrapped in foil for a shelf life of several months.

Holographic Recording

Figure 2:
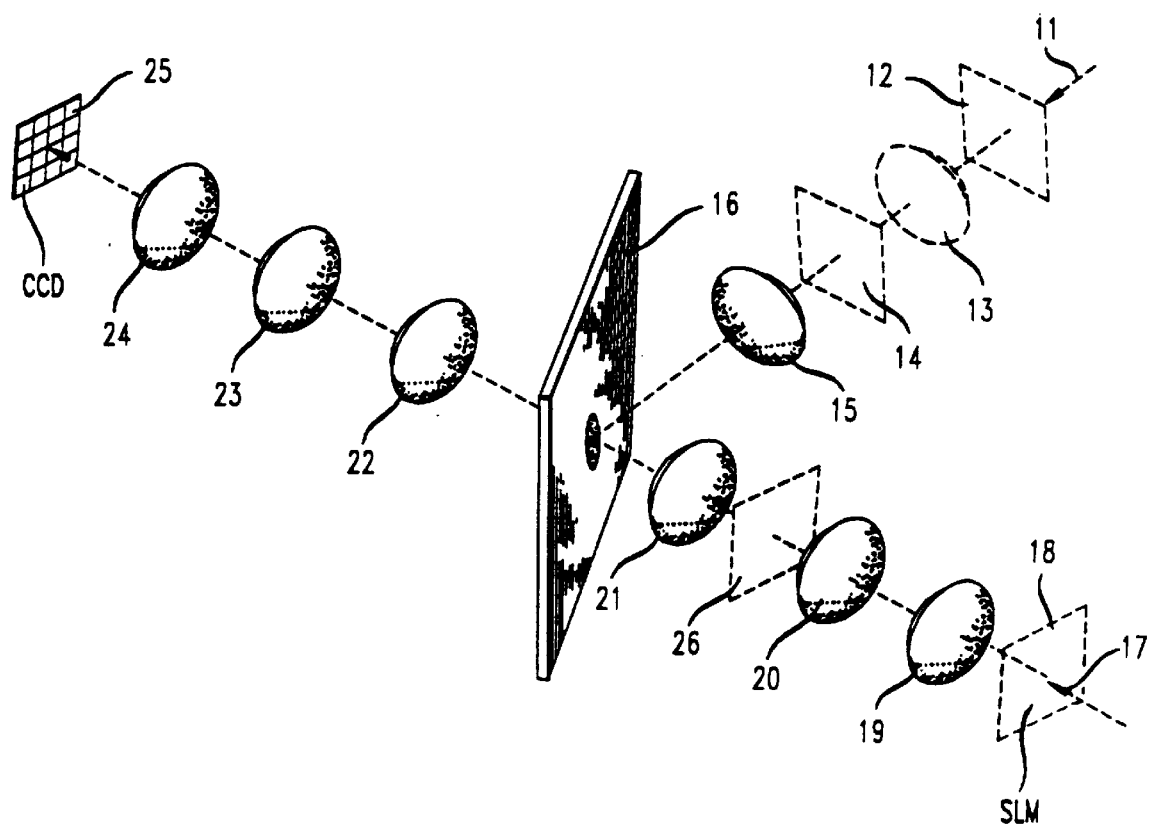
FIG. 2 is a schematic representation of apparatus suitable for use in shift multiplex holography or phase correlation multiplex holography.

FIG. 2, taken from U.S. patent application Ser. No. 08/435,705, hereby incorporated by reference, is a schematic representation of apparatus useful for multiplex holography either by use of shift holography or phase correlation multiplex holography.

FIG. 2 shows incoming beam 11 which will serve as a reference beam. Considering the system for PCMH (co-pending U.S. patent application Ser. No. 08/435,705), the incoming beam is converted into a phase beam by a phase mask located on plane 12. It next passes through lens 13; is spatially filtered by a filter on plane 14; passes through lens 15 and strikes recording medium 16. With lenses 13 and 15 in 4F configuration, the mask is imaged on medium 16. Spatial filtering is effectively carried out on plane 14 (with plane 14 on the Fourier plane for the lens pair). Magnification of the mask image is determined by the focal lengths of the lenses. One set of experiments in this co-pending application used a random binary phase mask constituted of a 1024×1024 array of 20 $\mu$m pitch pixels. In this illustration, half of the randomly located pixels impose a phase-shift of 180° so that the average phase across the beam front is zero.

A second incoming beam 17 is modulated by spatial light modulator (SLM) 18. The resulting signal beam is routed through lenses 19, 20, and 21. Corresponding lenses 22, 23, and 24 are used in readout. With both sets of lenses in 4F configuration, a Fourier transform is recorded in medium 16, and an image is reconstructed on detector 25. (4F configuration requires focal distance spacings so that, e.g. SLM-to-lens spacing is equal to the focal distance of lens 19, lens 24-to-detector spacing is equal to the focal distance of lens 24, and lens-to-lens spacings are the sums of the focal distances of the lenses in the pair). Omitting a single lens in lens set 19, 20, 21 replaces the transform with the image at the medium—omitting a lens in set 22, 23, 24 again results in image reconstruction at the detector.

The specifics of the arrangements of FIG. 2 are illustrative. By omitting the phase mask, lens 13, and the spatial filter at plane 14, and by defocusing the reference beam to obtain sufficient overlap with the signal beam, the system is suitable for "shift holography". The figure is intended to represent other forms of multiplex holography, in which successive pages are completely superimposed in the same region of the medium, as well as single-page holography (without multiplexing).

Variants include lens arrangements for recording or detecting a Fourier transform or an image of the signal with enlargement or reduction, and for additional spatial filtering for improved SNR. Individual plane waves, multiple plane waves, and spherical beams have been used as reference beams in more traditional holography and can be used here as well. The precise position of the phase mask in PCMH, is not critical, but, together with other elements in the reference path, must be in the same position for recording and readout. A phase mask in contact with SLM 18 or at image plane 26 assures uniform brightness of the signal beam for optimal recording. The signal beam may be filtered to eliminate noise or higher-order diffraction modes. 4F spacing may be replaced by other lens arrangements either for imaging or for Fourier transform.

Writing beams at 532 nm were supplied by a diode-pumped Nd:YAG laser. The external half-angle between beams was 18.5°, resulting in an internal angle of 12.2° and a d-spacing of 839 nm. In some experiments, grating formation was monitored in real-time with a HeNe laser operating at 632 nm. Once holographic recording was complete, polymer samples could be stabilized by a final flood cure. A Xe lamp providing 10 mW/cm$^2$ integrated radiation dose at $\lambda$=530 nm stabilized material against further photoinduced reactions (readout was not measurably affected after unwrapped storage under ordinary room lighting for a period of 15 min.).

EXAMPLES

Procedures outlined under "Fabrication" were followed.

Example 1

40 g. of isobornyl acrylate (IBA), was placed in a foil-wrapped brown bottle. 1 g. photoinitiator was added and the mixture was stirred with a magnetic stir bar to dissolve. 60 g.—polytetrahydrofuran diurethane acrylate, mol.wt. ~2000, oligomer, was added and the mixture was stirred overnight on a jar mill until homogeneous. The resulting resin was filtered in a nitrogen-pressurized stainless steel filter apparatus through 20, 10 and 3 $\mu$m filters, successively, and stored in a refrigerator until needed. Before sample preparation, t-butyl hydroperoxide (TBHP), 0.16 g, was added while stirring.

Samples were prepared from this formulation by placing 0.4 mL of resin—allowed to come to room temperature—onto a glass plate mounted on an interferometer stage. A second glass plate was lowered onto the resin to the desired sample thickness using a micrometer. The outer surfaces of the glass plates were made parallel by leveling the plates and monitoring with a reflectance interferometer. A 20° holographic diffuser was placed on top of the sample and the sample was cured to the desired level of precure by irradiation with an Hg lamp, filtered to provide approximately 10 mW/cm$^2$ of 546 nm radiation while blocking radiation of—><530 nm. The degree of cure was monitored by near-IR spectroscopy. Writing was done with an external theta of 15 degrees, corresponding to a d spacing of 1808 nm. The sample was then post cured under τ>530 nm radiation from a filtered Xe lamp for 15 minutes. A 180 μm thick sample of this formulation precured to 85% of total gave a peak diffraction efficiency of 23%, corresponding to a grating constant (Δn) of 0.00052 under these writing conditions.

Example 2

Following the procedure of Example 1, 10 g N-vinylcarbazole was mixed with 30 g IBA, PI (1 g), oligomer (60 g) and TBHP (0.16 g). The mixture was filtered and used to prepare samples. A 210 μm thick sample, prepolymerized to 82% cure, resulted in a Δn of 0.0012.

Example 3

Vinyl benzoate (10 g) was mixed with IBA (30 g) PI (1 g), oligomer (60 g) and TBHP (0.16 g). This resin was filtered and used to prepare samples. A 60 μm thick sample, prepolymerized to 86% cure, resulted in a Δn of 0.0015 under similar writing conditions.

Example 4

A mixture of 10 g of "terathane" (polytetrahydrofuran) of molecular weight 2000, and 2.2 g of isophorone diisocyanate was heated and stirred mixing was complete after a few minutes. One drop of dibutyltin dilaurate was added, and the mixture was heated to 70° C. and then allowed to cool to 50° C. A 1.3 g portion of 4-hydroxymethylcyclohexene oxide, that had been prepared by the 3-chloroperbenzoic acid oxidation of 4-hydroxymethylcyclohexene, was added, and heated to a temperature of 80° C. The product was degassed under vacuum, and allowed to cool.

One gram of the above product was mixed by gently heating and stirring with 0.12 g of a 5% w/w solution of PI in phenoxyethyl acrylate and 0.08 g of a 5% w/w solution of PI in IBA. After cooling to room temperature, 2 drops of trimethoxyboroxine was added as an epoxy cure catalyst. The mixture was quickly applied inside the area defined by a 0.1 mm thick circular teflon spacer resting on a glass microscope slide. The sample was covered by a second glass slide and cured at 90° C. for 3 h in the dark. A grating with a diffraction efficiency of about 0.5% was written in the sample. As in the above examples, post-curing for 15 min. at room temperature was sufficient for consumption of polymerizable groups—Δn, measured before and after postcuring, varied by <10%.

The invention claimed is:

1. Method comprising holographic recording in a recording medium, said recording being attended by photopolymerization within selectively irradiated regions, such medium comprising an active layer for recording radiation-defined features, whereby refractive index is changed responsive to radiation, the layer containing polymerized matrix material serving as a host to "actinic" monomeric material which responds to such radiation by photopolymerization, said recording including holographic exposure comprising irradiating at least a portion of the layer with overlapping radiation beams, thereby forming a hologram

CHARACTERIZED IN THAT said polymerized matrix material is produced by in-situ polymerization of a polyfunctional oligomer of molecular weight ≧1000 during a precuring step conducted prior to said holographic exposure, and in that at least 70 wt. % of total monomeric material is monofunctional.

2. Method of claim 1 in which said radiation is within the visible spectrum, in which said precuring and recording entail polymerization of material of similar reactivity with both initiated by radiation within the visible spectrum, said precuring being carried out under conditions such as to incorporate said monomer material in the matrix.

3. Method of claim 1 in which at least 20 wt. % of total said monomeric material survives precuring.

4. Method of claim 1 in which the medium contains an additional material which migrates in response to irradiation so as to enhance diffraction efficiency.

5. Method of claim 1 including a post-curing step following recording in which remaining monomeric material is rendered inert to radiation within the visible spectrum.

6. Method of claim 1 comprising phase correlation multiplex holography.

7. Method of claim 1 in which the in-situ polymerization of said oligomer is conducted by a supplier of the medium.

* * * * *